US 6,576,517 B1

(12) United States Patent
Patelmo et al.

(10) Patent No.: US 6,576,517 B1
(45) Date of Patent: Jun. 10, 2003

(54) METHOD FOR OBTAINING A MULTI-LEVEL ROM IN AN EEPROM PROCESS FLOW

(75) Inventors: Matteo Patelmo, Bernareggio (IT); Giovanna Dalla Libera, Monza (IT); Nadia Galbiati, Seregno (IT); Bruno Vajana, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/474,944

(22) Filed: Dec. 30, 1999

(30) Foreign Application Priority Data

Dec. 31, 1998 (EP) .............................. 98830811

(51) Int. Cl.$^7$ ......................................... H01L 21/8234
(52) U.S. Cl. ....................................... 438/275; 438/258
(58) Field of Search ................................ 438/130, 238, 438/257, 258, 275, 278, 601, 157, 283

(56) References Cited

U.S. PATENT DOCUMENTS

| 5,227,326 A | 7/1993 | Walker ........................ 437/52 |
| 5,468,666 A | 11/1995 | Chapman ..................... 437/44 |
| 5,504,030 A | 4/1996 | Chung et al. ................. 437/52 |
| 5,541,876 A | 7/1996 | Hsue et al. .................. 365/178 |
| 5,780,330 A | 7/1998 | Choi ........................... 438/232 |
| 5,793,086 A | 8/1998 | Ghio et al. .................. 257/390 |
| 5,822,243 A | 10/1998 | Shone .................... 365/185.08 |
| 5,844,839 A | 12/1998 | Smayling et al. ...... 365/185.23 |
| 6,177,313 B1 | 1/2001 | Patelmo et al. ............. 438/257 |
| 6,191,460 B1 | 2/2001 | Choi et al. .................. 257/393 |

FOREIGN PATENT DOCUMENTS

| EP | 0 627 742 A2 | 12/1994 |
| EP | 0 661 751 A1 | 7/1995 |
| EP | 0 890 985 A1 | 1/1999 |
| EP | 0 991 118 A1 | 4/2000 |
| EP | 0991118 A1 * | 5/2000 |
| JP | 3-177065 | 8/1991 |

OTHER PUBLICATIONS

Hart, M. et al., "A Back–Biased 0.65 µm Leffn CMOS EEPROM Technology for Next–Generation Sub 7 ns Programmable Logic Devices," *Microelectronic Engineering*, 15(1/4):pp. 613–616, Oct. 1991.
Patent Abstracts of Japan, Abstract of JP 9–232449, Sep. 5, 1997.

* cited by examiner

Primary Examiner—David Nelms
Assistant Examiner—Phuc T. Dang
(74) Attorney, Agent, or Firm—Lisa K. Jorgenson; Robert Iannucci; Seed IP Law Group PLLC

(57) ABSTRACT

Presented is a method for obtaining a multi-level ROM in a dual gate EEPROM process flow. The method begins with, on a semiconductor substrate, defining active areas respectively for transistors of ROM cells, transistors of electrically erasable non-volatile memory cells, and additional transistors of the storage circuitry. Then, integrated capacitors are integrated in the storage circuit. According to this method, during the implanting step for forming integrated capacitors, at least an active area of the ROM cell is similarly implanted.

10 Claims, 3 Drawing Sheets

Programming masks WELL HV e LV

HV
LV

Programming masks n+ & p+ p+
n+

METHOD FOR OBTAINING A MULTI-LEVEL ROM IN AN EEPROM PROCESS FLOW

TECHNICAL FIELD

This invention relates to a method for obtaining a multi-level ROM in an EEPROM process flow, as well as a memory cell structure formed thereby.

BACKGROUND OF THE INVENTION

The invention relates to a ROM structure having transistor cells which are integrated in a semiconductor by a dual gate EEPROM process flow, along with transistors for electrically erasable non-volatile memory cells, and with storage circuitry transistors; all these transistors having active areas covered with a layer of gate oxide, itself overlaid with a polysilicon layer.

In this technical field, there is a pressing demand for integration of both ROM (Read Only Memory) circuits and electrically erasable non-volatile memories, such as EEPROMs and/or Flash EEPROMs, into a single semiconductor electronic device. This demand comes especially from the smart card market, and involves considerable complications to the process of manufacturing such integrated electronic devices.

The technologies employed in the manufacture of either types of circuits are not fully compatible, resulting in increased manufacturing costs and less-easily-achieved high throughputs. Furthermore, advancements in cryptography require extending codes in terms of number of bits which are difficult to decode by reverse engineering.

Also known is that a set or array of ROM cells essentially consists of an array of MOS transistors having conventional source, drain and gate terminals, and having their threshold voltages set during the manufacturing process.

These thresholds are differentiated such that, through the intermediary of an appropriate sensing circuit, it becomes possible to determine which of the cells are ON (logic 1) and which are OFF (logic 0) for a given bias of the transistor gate terminals. Those cells which are in a logic 1 state usually can be discriminated from those in a logic 0 state by implanting the source region and not implanting drain junctions during the step of implanting these transistor regions.

This prior approach provides cells with a logic 1 and/or a logic 0 value, but disallows discriminating them immediately by optical scanning.

There have been other approaches whereby the logic 1 and 0 values can be discriminated based on the presence or the absence of a transistor. However, there is no currently available technology which can provide a multi-level ROM structure, i.e. one capable of storing plural logic values in each memory cell.

SUMMARY OF THE INVENTION

Embodiments of this invention provide a novel method for obtaining a multi-level ROM in a dual gate CMOS process, such that a higher capacity for data storage can be provided by a readily integrated product with CMOS technology.

Principles of the invention provide a ROM cell which can store six distinct logic levels. This cell is formed by first utilizing the LV and HV well implantations and the capacitor implantation to provide additional levels in the ROM, whereafter two different dopant implantings are used for the polysilicon layer which forms the transistor gate region.

Briefly, the step of implanting the source/drain regions of the transistor which comprises a cell is carried out separately from the polysilicon implanting step.

Therefore, presented is a method for obtaining a multi-level ROM in a dual gate EEPROM process flow. The method begins by defining active areas on a semiconductor substrate respectively for: transistors of ROM cells, transistors of electrically erasable non-volatile memory cells, and additional transistors of the storage circuitry. Then integrated capacitors in the storage circuit are implanted, and during this implantation, at least an active area of the ROM cell is subjected to the same implantation.

In another embodiment, when the polysilicon layer is being etched to define the gate regions of the ROM cells, the gate regions of the high-voltage transistors are also defined.

The features and advantages of the method and the memory cell structure according to the invention will be made apparent by the following description of embodiments thereof, given by way of non-limitative examples with reference to the accompanying drawings.

DETAILED DESCRIPTION

Figure 1:
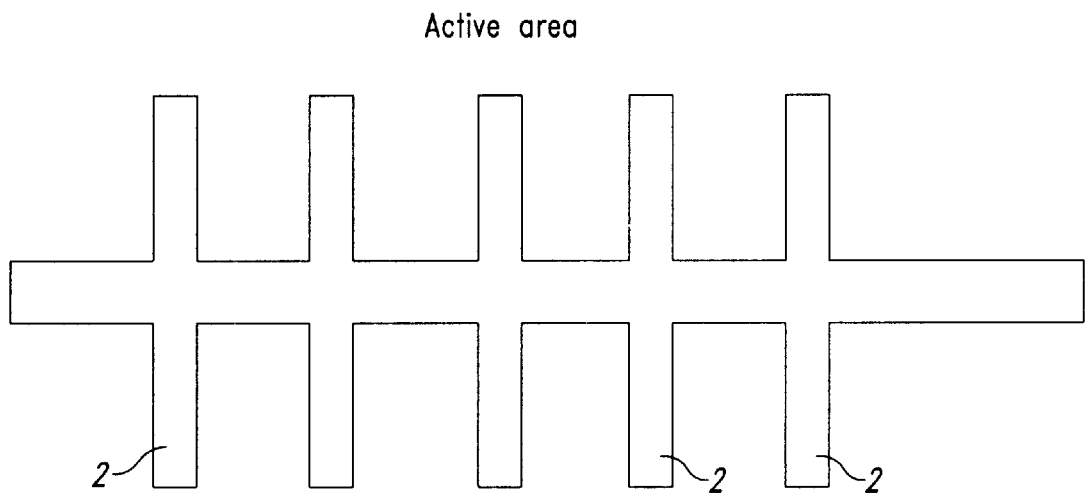
FIG. 1 is a top plan view showing diagramatically a portion of a semiconductor integrated circuit where at least one ROM cell is formed in accordance with an embodiment of the invention.

The process steps and structures described hereinafter do not reflect a complete process for manufacturing integrated storage circuits. This invention can be practiced in combination with integrated circuit manufacturing techniques in current use, and only such process steps as are necessary to an understanding of this invention will be discussed.

The drawing figures that show in plan view portions of an integrated circuit at different stages of its fabrication are not drawn to scale but rather to highlight major features of the invention.

Referring in particular to FIG. 1, the steps of an embodiment of the inventive method which result in multi-level ROM cells 1 being obtained in a dual gate type of EEPROM process flow will be discussed herein below.

To produce EEPROM cells in latest-generation CMOS processes, the MOS transistors are usually formed with doped gate regions using the same dopant type as for the channel region, which explains the term "dual gate" adopted in the industry. To this aim, the gate region must be left unprotected during the source and drain heavy implantation steps.

Advantageously in embodiments of this invention, the storage circuit that incorporates the ROM cells 1 is integrated in a semiconductor along with another type of a storage circuit which incorporates electrically programmable non-volatile cells of either the EEPROM or the Flash EEPROM type comprising respective MOS transistors. The source and drain junctions of these LV (Low Voltage) MOS transistors are usually formed with a gradual profile by a double dopant implantation known as LDD (Lightly Doped Drain).

The integrated circuit of this embodiment also contains HV (High Voltage) transistors which are necessary to handle the high voltages (>12V) at the programming stage of the non-volatile memory cell. During the heavy source/drain implantation step carried out for the LV transistors, the HV transistors would be masked off completely. An additional heavy implantation is performed in contact regions to ensure good contacting.

The process steps that implement the method of this invention will now be described. Reference will be made hereinafter to an example comprising n-channel cells, but the same considerations would apply to p-channel cells if the dopant types are all reversed.

The active areas of the transistors which are parts of the aforementioned storage circuits are first defined in a semiconductor substrate 10. Accordingly, the active areas of the ROM cells 1 and the active areas of the MOS transistors forming parts of the Flash EEPROM circuit portion will be defined.

For example, active areas 2 are defined for the transistors comprising the ROM cells, as shown in FIG. 1. The active areas 2 are T-shaped. Shown in FIG. 1 are only an arbitrary number of adjacent cells, each having a respective active area 2.

At this stage, an implantation is performed to provide integrated capacitors in the storage circuit. Advantageously, the capacitor implanting step is utilized in this invention for shorting certain ROM cells such that they show a threshold voltage of 0V.

Figure 2A:
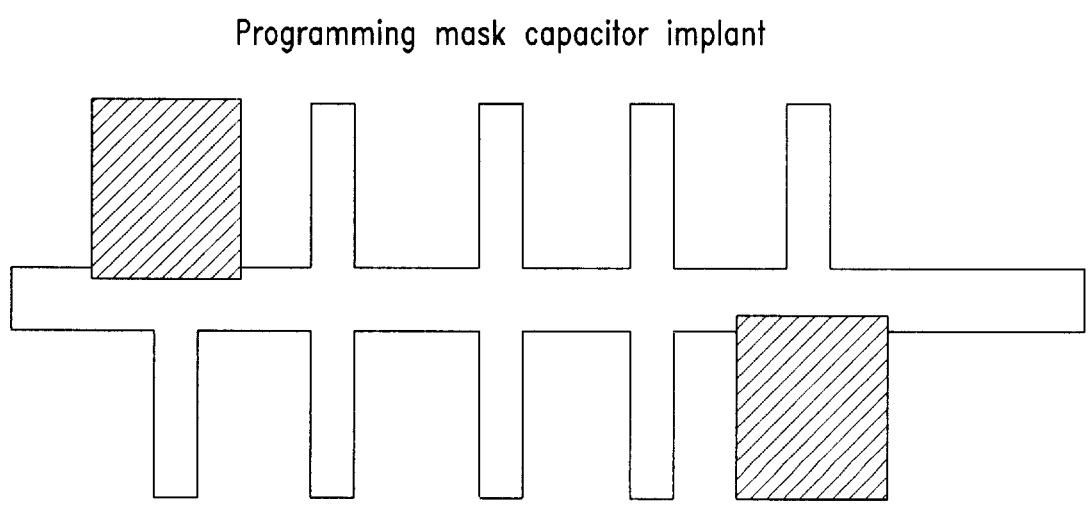
FIG. 2a is a top plan view showing diagramatically the same integrated circuit portion during a subsequent step in the method.

FIG. 2a shows, by way of example, those active areas of the multi-level ROM cells 1 which are affected by the implantation during the formation of capacitors in other areas of the integrated storage circuit.

Advantageously, the process of this invention goes on with a well-implanting step.

Specifically, HV well implants are provided for transistors which have a lightly doped channel, and LV well implants are provided for transistors which have a heavily doped channel. The former (lightly doped channel) transistors will have a lower threshold than the latter.

Figure 2B:
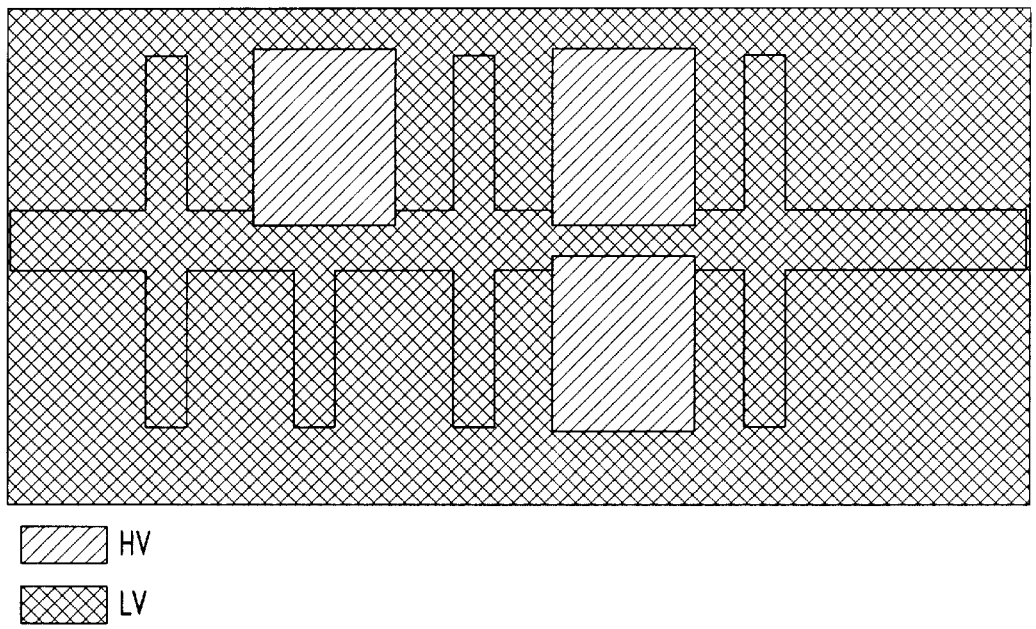
FIG. 2b is a top plan view showing diagramatically the same integrated circuit portion during a further step in the method.

Shown in FIG. 2b are those portions of the active areas of the multi-level ROM cells 1 which are affected by the HV and the LV implanting step, respectively.

At this point, a thin layer of gate oxide is grown on top of the active areas 2. This step would be preceded by oxidation of the storage circuitry throughout.

Figure 3:
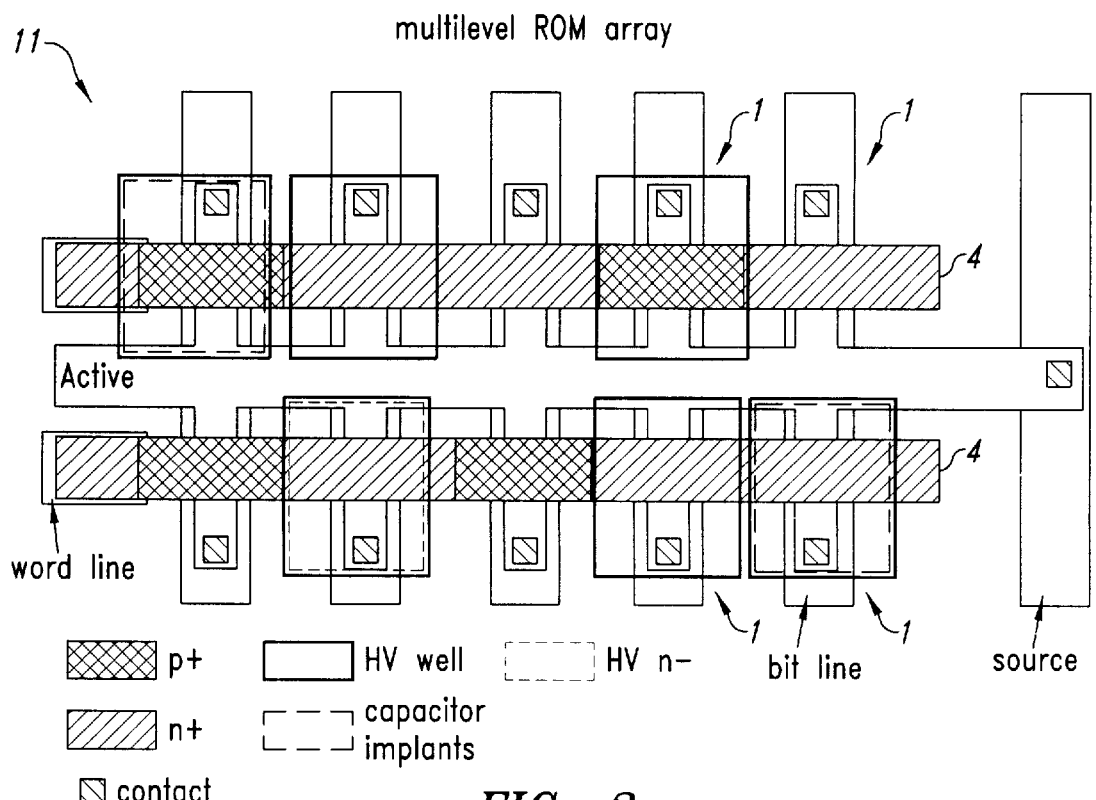
FIG. 3 is a top plan view showing diagramatically the same integrated circuit portion at the end of the manufacturing process.

A polysilicon layer 4 (FIG. 3), as needed to form the gate regions of the memory cell transistors, is then deposited.

Conventional masking, etching, washing and implanting steps result in the standard low-voltage MOS transistors being defined with source and drain junctions of the LDD type to form Flash EEPROM memory cells. These steps are followed by the steps of poly layer-defining, LDD-implanting, spacer-forming, and of performing heavy source/drain implantations for the LDD transistors. (FIG. 2b)

However, the gate regions of the multi-level ROM cell transistors would be defined later on, rather than at this stage.

Figure 2C:
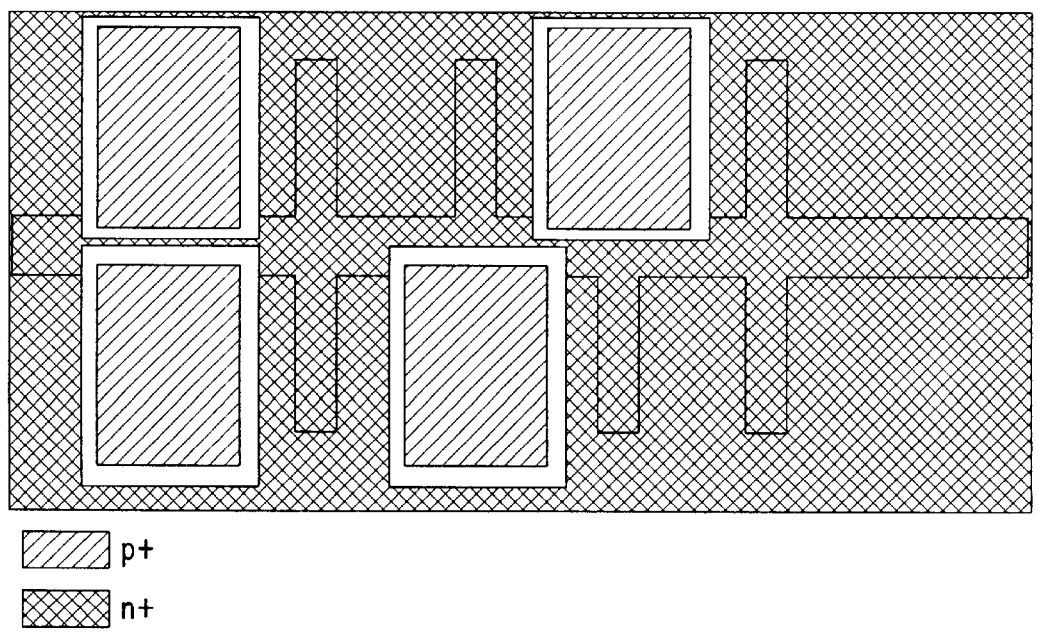
FIG. 2c is a top plan view showing diagramatically the same integrated circuit portion during a subsequent step in the method.

During the source/drain n+ implanting step, some of the ROM cells 1—those shown in FIG. 2c—are masked off such that their polysilicon layer in the gate region can later be subjected to a p+ dopant implanting step. This masking step essentially allows the logic state of the ROM cell to be programmed, and its mask can be referred to as the programming mask.

The cells 1 mentioned above will be exposed by the time that the p+ source/drain implantation is to be performed.

In essence, one step of the method according to this embodiment consists of n-doping the poly layer 4, followed by a step of P-doping the poly layer 4. This takes place with no source/drain doping.

Thus, provided in the process are two different poly dopings, meaning that the process is of the dual gate type, wherein the gate is doped with the same dopant as the channel region of the cell.

In addition, it is important that the source/drain implantation be carried out at a different time from the polysilicon implantation.

Upon completion of these process steps, the polysilicon layer 4 of a matrix 11 of ROM cells 1 will be doped in some areas with dopant of the n type, and with dopant of the P type in other areas. Thus, the poly layer 4 of the cell matrix 11 having n-doped gates will exhibit a typical threshold, whereas the cells having p-doped gates will have a much higher threshold due to the different working function served by the p-doped polysilicon relative to the n-doped one. This allows the two first working logic levels of the storage structure according to the invention to be defined.

The poly layer of the cell matrix 11 is then defined by an appropriate masking step, followed by etching. This etching step will also define the HV transistors of the integrated circuit and the transistors which comprise the Flash EEPROM cells.

Figure 2D:
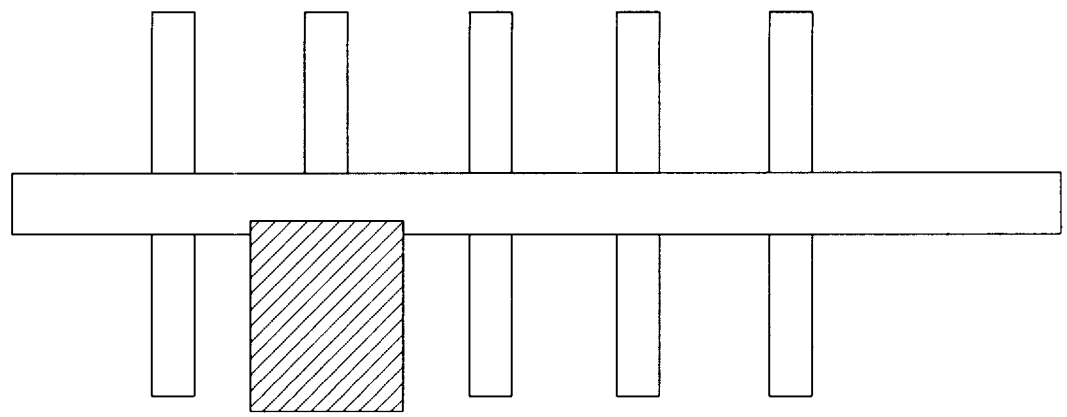
FIG. 2d is a top plan view showing diagramatically the same integrated circuit portion during yet another step in the method.

Light source/drain implantations are then carried out for the cell matrix. During these implantations, so-called released cells are formed which undergo no source/drain implantation. These cells, shown in FIG. 2d as an example, are not conveying current in any of the bias conditions and represent a further storage level.

The solution proposed allows ROM cells with up to six logic levels per cell to be formed by a dual gate process with no additional masks to a standard process flow for producing EEPROMs or Flash EEPROMs useful in smart cards.

The array of ROM cells is obtained in a natural way with six logic levels per cell, which allow the storage capacity of the ROM to be increased exponentially.

The threshold difference between any two levels is sufficiently large for discrimination even in the presence of typical variations of an industrial process, wherein standard deviations of about 100 mV are to be expected for the thresholds.

The following table shows some typical threshold values for the levels to be obtained in a submicron EEPROM process.

TABLE 1

| Thresholds | HV well | LV well | Capacitor implant |
|---|---|---|---|
| p-gate | ~2 V | ~1.6 V | 0 V |
| n-gate | ~1 V | ~0.6 V | 0 V |
| No HV implant n-(prior art) | ∞ | ∞ | 0 v |

For example, with eight cells, the number of bits or codes possible to store goes from $2^8=256$ codes to $6^8=1,679,616$ codes, with sixteen cells one goes to approximately 2E12 different levels, etc.

It is important to observe that the ROM cells are obtained, either as cells having a 0 threshold which are formed with the capacitor implantation, or as cells having additional storage levels to be obtained with the HV and LV well implantations.

Thus, no more than a few levels can be selected, such as by utilizing either the HV/LV well implantation alone or the capacitor implantation alone.

In other words, no more than six levels can be obtained although, by simplifying the process steps, multi-level ROMs can be formed with 3, 4 or 5 levels, to meet the user's requirements.

Of course, the storage structure of this invention would require special sensing circuitry for decoding the logic information contained at the six possible levels of each cell and translate it into binary logic. This is no bad trade-off, however, for the increased storage capacity.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method for obtaining a multi-level ROM in a dual gate EEPROM process flow, comprising:
   on a semiconductor substrate, defining active areas respectively for ROM cell transistors, transistors of electrically erasable non-volatile memory cells, and additional transistors of the storage circuitry;
   implanting integrated capacitors in the storage circuity and implanting at least one of the active areas for the ROM cell transistor.

2. The method according to claim 1, further comprising:
   implanting HV wells for the additional transistors having lightly doped channels while simultaneously implanting at least one of the active areas for the respective ROM cell transistor; and
   implanting LV wells for the additional transistors having heavily doped channels while simultaneously implanting at least one of the active areas for the respective ROM cell transistor.

3. The method according to claim 2, further comprising:
   depositing a layer of gate oxide onto said active areas;
   depositing a polysilicon layer over the gate oxide layer;
   masking and etching away the polysilicon layer to define respective gate regions for the additional transistors implanted with LV wells, while simultaneously masking the polysilicon layer of some of the ROM cell transistors, leaving other ROM cell transistors exposed;
   implanting a first dopant species in the active areas of the exposed ROM cell transistors;
   removing the mask from the polysilicon layer;
   implanting a second dopant species in said previously covered polysilicon layer; and
   masking and etching away the polysilicon layer to define the gate regions for the ROM cell transistors, the additional transistors that were implanted with HV wells, and for transistors of electrically erasable non-volatile memory cells.

4. The method according to claim 3, wherein masking and etching away the polysilicon layer to define the gate regions for the ROM cell transistors comprises also defining the gate regions of the additional transistors that were implanted with HV wells.

5. The method according to claim 3, wherein implanting a first dopant species in the active areas of the exposed ROM cell transistors; comprises fully masking some of the ROM cell transistors and implanting a light dosage of a first dopant to provide source and drain regions for the unmasked ROM cell transistors.

6. The method according to claim 1, further comprising:
   depositing a layer of gate oxide onto said active areas;
   depositing a polysilicon layer over the gate oxide layer;
   masking and etching away the polysilicon layer to define respective gate regions for the additional transistors implanted with LV wells, while simultaneously masking the polysilicon layer of some of the ROM cell transistors, leaving other ROM cell transistors exposed;
   implanting a first dopant species in the active areas of the exposed ROM cell transistors;
   removing the mask from the polysilicon layer;
   implanting a second dopant species in said previously covered polysilicon layer; and
   masking and etching away the polysilicon layer to define the gate regions for the ROM cell transistors, the additional transistors that were implanted with HV wells, and for the transistors of electrically erasable non-volatile memory cells.

7. The method according to claim 3, wherein masking and etching away the polysilicon layer to define respective gate regions for the additional transistors implanted with HV wells and implanted with LV wells and masking and etching away the polysilicon layer to define the gate regions for the ROM cell transistors occur simultaneously.

8. The method according to claim 7, further comprising lightly implantating the semiconductor substrate to form source and drain regions for the exposed ROM cell transistors.

9. A method of making ROM structure having ROM cell transistors that are integrated in a semiconductor substrate by a dual gate CMOS process, along with low-voltage transistors for electrically erasable non-volatile memory cells, and with high-voltage transistors, the ROM cell transistors, low-voltage transistors, and high-voltage transistors having respective active areas, the method comprising:
   covering the active areas of the transistors with a layer of gate oxide;
   overlaying the gate oxide layer with a polysilicon layer;
   subjecting the active area of a first one of the ROM cell transistors to a capacitor implantation step before covering the first ROM cell transistor with the gate oxide layer; and
   subjecting the active area of a second one of the ROM cell transistors to well implantation step before covering the second ROM cell transistor with the gate oxide layer.

10. The method of claim 9, further comprising doping a portion of the polysilicon layer for the first ROM cell transistor with dopants of a first type and doping a portion of the polysilicon layer for the second ROM cell transistor with dopants of a second type.

* * * * *